United States Patent
Kanazawa (10) Patent No.: US 8,610,331 B2
(45) Date of Patent: Dec. 17, 2013

(54) DRIVING METHOD FOR PIEZOELECTRIC VIBRATOR, AND DUST REMOVING DEVICE AND ULTRASONIC MOTOR USING THE DRIVING METHOD

(75) Inventor: Hajime Kanazawa, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 97 days.

(21) Appl. No.: 13/273,172

(22) Filed: Oct. 13, 2011

(65) Prior Publication Data

US 2012/0110758 A1    May 10, 2012

(30) Foreign Application Priority Data

Nov. 4, 2010 (JP) .................................. 2010-247633

(51) Int. Cl.
*H01L 41/08* (2006.01)
(52) U.S. Cl.
USPC ....................................................... 310/316.01
(58) Field of Classification Search
USPC ...................................... 310/316.01, 317, 319
See application file for complete search history.

(56) References Cited

U.S. PATENT DOCUMENTS

| | | | | |
|---|---|---|---|---|
| 4,176,524 A | * | 12/1979 | Kamiyama et al. | 62/140 |
| 5,455,475 A | * | 10/1995 | Josse et al. | 310/316.01 |
| 5,625,145 A | | 4/1997 | Maeno et al. | |
| 5,910,700 A | * | 6/1999 | Crotzer | 310/338 |
| 6,133,671 A | * | 10/2000 | Atsuta et al. | 310/316.01 |
| 6,404,108 B1 | * | 6/2002 | Yachi et al. | 310/330 |
| 7,298,066 B2 | * | 11/2007 | Kawaguchi et al. | 310/316.01 |
| 7,554,343 B2 | * | 6/2009 | Bromfield | 324/713 |
| 2001/0054307 A1 | * | 12/2001 | Hirota et al. | 73/54.24 |
| 2004/0047625 A1 | | 3/2004 | Ito | 348/335 |
| 2006/0267452 A1 | * | 11/2006 | Diefenbach et al. | 310/317 |
| 2008/0055459 A1 | | 3/2008 | Ito et al. | 348/335 |
| 2009/0002542 A1 | | 1/2009 | Ito et al. | 348/335 |
| 2009/0207493 A1 | | 8/2009 | Ohashi | 359/507 |
| 2010/0246001 A1 | | 9/2010 | Urakami et al. | 310/321 |

FOREIGN PATENT DOCUMENTS

| | | |
|---|---|---|
| JP | 4-26383 | 1/1992 |
| JP | 11-253900 | 9/1999 |

* cited by examiner

*Primary Examiner* — Mark Budd
(74) *Attorney, Agent, or Firm* — Fitzpatrick, Cella, Harper & Scinto (57) ABSTRACT

A driving method for a piezoelectric vibrator including a driving piezoelectric element and a detection piezoelectric element formed of the same material as a material of the driving piezoelectric element, for driving the piezoelectric vibrator by applying, to the driving piezoelectric element, an alternating voltage having a frequency close to a resonance frequency of the piezoelectric vibrator, the driving method including, in the case where it is detected based on variations in output detected from the detection piezoelectric element that at least one of variations in mechanical resistance of the piezoelectric vibrator and variations in piezoelectric characteristic of a piezoelectric element have occurred, applying an alternating voltage adjusted in accordance with the variations in mechanical resistance of the piezoelectric vibrator and/or the variations in piezoelectric characteristic of the piezoelectric element, to thereby adjust an electrical input to the piezoelectric vibrator to suppress variations in vibration amplitude of the piezoelectric vibrator.

28 Claims, 3 Drawing Sheets

DRIVING METHOD FOR PIEZOELECTRIC VIBRATOR, AND DUST REMOVING DEVICE AND ULTRASONIC MOTOR USING THE DRIVING METHOD

BACKGROUND OF THE INVENTION

1. Field of the Invention

The present invention relates to a driving method for a piezoelectric vibrator, and more particularly, to a driving method for a piezoelectric vibrator for use in an ultrasonic motor to be used in autofocus driving of a single lens reflex camera, for use in a dust removing device for removing dust adhering onto an optical element of a single lens reflex camera, or for other similar uses.

2. Description of the Related Art

Conventional examples of a device using a piezoelectric vibrator constituted by a piezoelectric element are an ultrasonic washer (see Japanese Patent Application Laid-Open No. H11-253900) and a dust removing device (see US 2009/207493 A1), or the like.

In those devices, the piezoelectric vibrator is caused to vibrate by applying the piezoelectric element with an alternating voltage having a frequency close to the resonance frequency of mechanical vibration of the piezoelectric vibrator, and the generated vibration is caused to act on another component, to thereby attain the feature of the device.

As described in Japanese Patent Application Laid-Open No. H11-253900, it is known that a piezoelectric vibrator suffers from variations in characteristics, such as the deterioration, after long-term use.

In the ultrasonic washer described in Japanese Patent Application Laid-Open No. H11-253900, however, a sound pressure sensor is provided for detecting deterioration of an ultrasonic vibrator, thus causing a problem in that the size of the device increases to increase manufacturing cost.

The piezoelectric vibrator in the dust removing device of US 2009/207493 A1 includes, in addition to a driving piezoelectric element, a sensor which is constituted by a vibration detection piezoelectric element formed of the same piezoelectric material as that of the driving piezoelectric element, thus being capable of preventing the size of the device and manufacturing cost from being increased much.

Detecting the deterioration of the ultrasonic vibrator by using the vibration detection piezoelectric element formed of the same material as that of the driving piezoelectric element, however, causes the following problem. According to the dust removing device, in the case where there is no change (or a small change) in an output voltage per unit amplitude of the vibration detection piezoelectric element between before and after the deterioration of the piezoelectric vibrator, the same vibration amplitude can be obtained as follows.

In other words, even after the deterioration, the same vibration amplitude as before the deterioration can be obtained by adjusting an input so that the output of the deteriorated vibration detection piezoelectric element may be equal to the output of the vibration detection piezoelectric element before the deterioration.

It is conceivable, however, that the variations in characteristics of the piezoelectric vibrator are caused not only by the increase in mechanical resistance of the piezoelectric vibrator by long-term use but also by deterioration in piezoelectric characteristic of the piezoelectric element.

Depending on the factor of the variations in characteristics of the piezoelectric vibrator, the above-mentioned conventional adjusting method cannot always adjust the input with high accuracy.

SUMMARY OF THE INVENTION

The present invention has been made in view of the above-mentioned problems, and it is an object thereof to provide a driving method for a piezoelectric vibrator, which is capable of carrying out adjustment in accordance with a factor of variations in characteristics caused by deterioration of the piezoelectric vibrator after long-term use, without accompanying the increase in size of the device and the increase in manufacturing cost.

Further, it is another object of the present invention to provide a dust removing device and an ultrasonic motor to which the driving method for a piezoelectric vibrator is applied.

According to the present invention, there is provided a driving method for a piezoelectric vibrator including a driving piezoelectric element and a detection piezoelectric element formed of the same material as a material of the driving piezoelectric element, for driving the piezoelectric vibrator by applying, to the driving piezoelectric element, an alternating voltage having a frequency close to a resonance frequency of the piezoelectric vibrator, the driving method including, in the case where it is detected based on variations in output detected from the detection piezoelectric element that at least one of variations in mechanical resistance of the piezoelectric vibrator and variations in piezoelectric characteristic of a piezoelectric element have occurred, applying an alternating voltage which is adjusted in accordance with the variations in mechanical resistance of the piezoelectric vibrator and/or the variations in piezoelectric characteristic of the piezoelectric element, to thereby adjust an electrical input to the piezoelectric vibrator to suppress variations in vibration amplitude of the piezoelectric vibrator.

Further, a dust removing device according to the present invention includes a dust removing unit for removing dust on a target by vibration of a piezoelectric vibrator, in which the piezoelectric vibrator is driven by the above-mentioned driving method for a piezoelectric vibrator.

Further, an ultrasonic motor according to the present invention includes: a piezoelectric vibrator; and a movable body which is in frictional contact with the piezoelectric vibrator and capable of moving by vibration of the piezoelectric vibrator, in which the piezoelectric vibrator is driven by the above-mentioned driving method for a piezoelectric vibrator.

According to the present invention, there may be realized a driving method for a piezoelectric vibrator, which is capable of carrying out adjustment in accordance with a factor of variations in characteristics caused by deterioration of the piezoelectric vibrator after long-term use, without accompanying the increase in size of the device and the increase in manufacturing cost.

There may also be realized a dust removing device and an ultrasonic motor to which the driving method for a piezoelectric vibrator is applied.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

A driving method for a piezoelectric vibrator according to the present invention, which is capable of carrying out adjustment in accordance with a factor of deterioration of the piezoelectric vibrator, is based on the discovery by the inventors of the present invention that the factor of the deterioration of the piezoelectric vibrator contains the following two factors.

One factor is the increase in mechanical resistance of the piezoelectric vibrator, that is, the increase in internal loss of the piezoelectric vibrator, namely the increase in damping.

The other factor is the deterioration in piezoelectric characteristic of a piezoelectric element.

In the case where the deterioration of the piezoelectric vibrator has occurred just because of the increase in mechanical resistance of the piezoelectric vibrator, there is no change in an output voltage per unit amplitude of a vibration detection piezoelectric element between before and after the deterioration of the piezoelectric vibrator.

Therefore, even after the deterioration, the same vibration amplitude as before the deterioration can be obtained by adjusting an input so that the output of the deteriorated vibration detection piezoelectric element may be equal to the output of the vibration detection piezoelectric element before the deterioration.

However, in the case where the factor of the deterioration of the piezoelectric vibrator is the deterioration in piezoelectric characteristic of the piezoelectric element, the deterioration in piezoelectric characteristic of the vibration detection piezoelectric element occurs as well as deterioration in piezoelectric characteristic of a driving piezoelectric element.

The output voltage per unit amplitude of the vibration detection piezoelectric element thus changes. It follows that the method of adjusting the input so that the output of the deteriorated vibration detection piezoelectric element may be equal to the output of the vibration detection piezoelectric element before the deterioration cannot obtain the same vibration amplitude after the deterioration as before the deterioration.

Therefore, in the conventional technology, appropriate adjustment in accordance with the variations in characteristics of the piezoelectric vibrator cannot be carried out without accompanying the increase in size of the device and the increase in manufacturing cost.

In light of the above, according to the present invention, in the driving method for a piezoelectric vibrator including a driving piezoelectric element and a detection piezoelectric element formed of the same material as that of the driving piezoelectric element, for driving the piezoelectric vibrator by applying, to the driving piezoelectric element, an alternating voltage having a frequency close to the resonance frequency of the piezoelectric vibrator, when it is detected based on variations in output detected from the detection piezoelectric element that at least one of variations in mechanical resistance of the piezoelectric vibrator and variations in piezoelectric characteristic of the piezoelectric element have occurred, variations in vibration amplitude of the piezoelectric vibrator are suppressed as follows.

That is, by applying an alternating voltage which is adjusted in accordance with the variations in mechanical resistance of the piezoelectric vibrator and/or the variations in piezoelectric characteristic of the piezoelectric element, an electrical input to the piezoelectric vibrator is adjusted to suppress the variations in vibration amplitude of the piezoelectric vibrator. According to this adjusting method, in any case where the deterioration of the piezoelectric vibrator has occurred because of the variations in mechanical resistance of the piezoelectric vibrator, the variations in piezoelectric characteristic of the piezoelectric element, or both the variations, a desired vibration amplitude can be obtained after the variations.

Embodiments

Embodiments of the present invention are described below.

Embodiment 1

Figure 1:
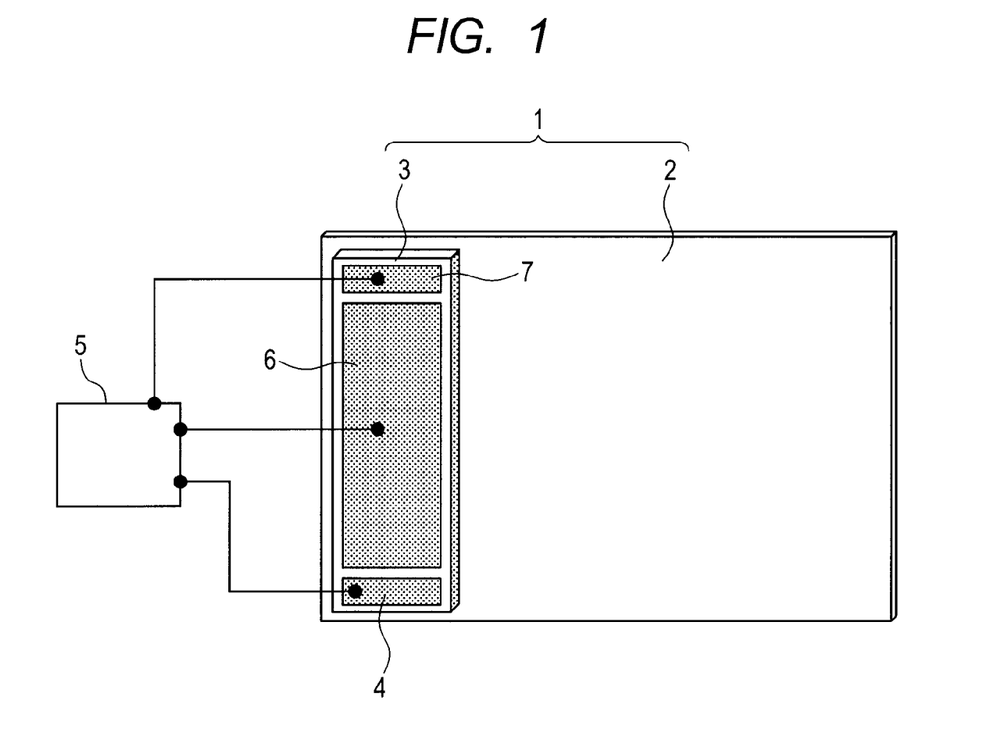
FIG. 1 is a diagram illustrating a configuration example of a piezoelectric vibrator for use in a dust removing device for removing dust adhering onto an optical element of a single lens reflex camera according to a first embodiment of the present invention.

Referring to FIG. 1, an embodiment 1 of the present invention is described by way of a configuration example of a piezoelectric vibrator for use in a dust removing device for removing dust adhering onto an optical element of a single lens reflex camera to which the present invention is applied.

A piezoelectric vibrator 1 includes an optical element 2 and a piezoelectric element 3 bonded onto the optical element.

The piezoelectric element 3 has a ground electrode (not shown) provided on the entire surface onto which the optical element 2 is bonded.

The ground electrode is electrically connected via a via electrode passing through the piezoelectric element 3 to a surface ground electrode 4 disposed on a part of the front surface opposite to the ground electrode. The ground electrode is further wired to a ground terminal of a driving circuit 5.

The most part of the front surface of the piezoelectric element 3 is occupied by a driving voltage application electrode 6, and the driving voltage application electrode 6 is wired to a driving voltage application terminal of the driving circuit 5.

A portion of the piezoelectric element 3 sandwiched between the ground electrode and the driving voltage application electrode 6 acts as a driving piezoelectric element.

A detection electrode 7 for detecting vibration is wired to a detection terminal of the driving circuit 5. Another portion of the piezoelectric element 3 sandwiched between the ground electrode and the detection electrode 7 acts as a detection piezoelectric element.

That is, the driving piezoelectric element and the detection piezoelectric element are formed of the same material.

In the above-mentioned configuration, in the case where the driving voltage application electrode 6 of the piezoelectric vibrator 1 for use in the dust removing device is applied with an alternating voltage having a frequency close to the resonance frequency of the piezoelectric vibrator 1, the piezoelectric vibrator 1 vibrates to remove dust adhering onto a target of an optical component.

Hereinafter, a driving method for a piezoelectric vibrator according to the embodiment 1 is described.

It is known that the relationships among vibration velocity, force, voltage and current of the piezoelectric vibrator are expressed by the following piezoelectric equations:

$$F = -A \cdot V + Zm \cdot v \quad (1)$$

$$I = Yd \cdot V + A \cdot v \quad (2)$$

where F is a force, A is a force factor, V is a voltage, Zm is a mechanical impedance, v is a vibration velocity, I is a current and Yd is an admittance according to a damping capacitance.

In the case where an alternating voltage Vin1 having the same frequency as the resonance frequency is input to the driving piezoelectric element via the driving voltage application electrode 6, a vibration with a vibration velocity v1 below is generated as is apparent from Expression (1):

$$v1 = \frac{Adr1 \cdot Vin1}{r1} = \frac{a \cdot d1 \cdot Vin1}{r1} \quad (3)$$

where Adr1 is a force factor of the driving piezoelectric element, r1 is a mechanical impedance at resonance of the piezoelectric vibrator, namely an initial mechanical resistance, d1 is an initial piezoelectric constant of the piezoelectric element, and a is a coefficient between the force factor of the driving piezoelectric element and the piezoelectric constant of the piezoelectric element.

In this case, the detection piezoelectric element generates a voltage corresponding to the vibration, the magnitude of which is expressed by Vs1 below, and the voltage having this magnitude is detected from the detection electrode 7.

Vs1 below is calculated by setting the current I of Expression (2) to zero:

$$Vs1 = -\frac{As1 \cdot v1}{Yd} = -\frac{b \cdot d1 \cdot v1}{j \cdot 2 \cdot \pi \cdot fr \cdot Cd} \quad (4)$$

where As1 is a force factor of the detection piezoelectric element, b is a coefficient between the force factor of the detection piezoelectric element and the piezoelectric constant of the piezoelectric element, j is an imaginary unit, fr is a resonance frequency, and Cd is the damping capacitance of the detection piezoelectric element.

Further, from Expressions (3) and (4), Expression (5) below is established:

$$Vs1 = -\frac{a \cdot b \cdot d1^2 \cdot Vin1}{j \cdot 2 \cdot \pi \cdot fr \cdot Cd \cdot r1} \quad (5)$$

The voltage of the detection piezoelectric element having this magnitude Vs1 is detected from the detection electrode 7. After long-term use of the piezoelectric vibrator 1, in the case where the piezoelectric constant of the piezoelectric element changes from d1 to d2 (which is a piezoelectric constant after at least one of variations in mechanical resistance and variations in piezoelectric characteristic have occurred), and in the case where the mechanical resistance changes from r1 to r2 (which is a mechanical resistance after at least one of variations in mechanical resistance and variations in piezoelectric characteristic have occurred), the detection piezoelectric element generates a voltage having the following magnitude Vs2:

$$Vs2 = -\frac{a \cdot b \cdot d2^2 \cdot Vin1}{j \cdot 2 \cdot \pi \cdot fr \cdot Cd \cdot r2} \quad (6)$$

A vibration velocity v2 in this case is expressed by Expression (7) below:

$$v2 = \frac{a \cdot d2 \cdot Vin1}{r2} = \frac{d2}{d1} \times \frac{r1}{r2} \times v1 \quad (7)$$

That is, in the case where at least one of the variations in mechanical resistance of the piezoelectric vibrator and the variations in piezoelectric characteristic of the piezoelectric element have occurred, the vibration velocity changes to the magnitude expressed by Expression (7).

On this occasion, according to the driving method for a piezoelectric vibrator of the embodiment 1, even after at least one of the variations in mechanical resistance of the piezoelectric vibrator and the variations in piezoelectric characteristic of the piezoelectric element have occurred, the vibration velocity having the same magnitude as that before the variations is obtained in the following manner.

i. A test alternating voltage Vtest is applied before the variations in mechanical resistance of the piezoelectric vibrator or the variations in piezoelectric characteristic of the piezoelectric element occur. The frequency of the test alternating voltage is swept at a frequency close to the resonance frequency, thereby storing a drive-mode Q-factor Q1 which is calculated from the measurement of the voltage Vs of the detection piezoelectric element and storing a value of a voltage Vstestfr1 of the detection piezoelectric element which is measured at the resonance frequency under the application of the test alternating voltage Vtest. Note that, the resonance frequency is a frequency at which the voltage Vs of the detection piezoelectric element becomes maximum when the frequency of the test alternating voltage is swept. The Q-factor as used herein is quality factor of resonator, and since the voltage of the detection piezoelectric element is almost proportional to the vibration amplitude, the Q-factor is calculated by a commonly-known method based on frequencies at which the voltage amplitude of the detection piezoelectric element becomes 1/√2 of the amplitude at the resonance frequency. That is, the Q-factor is calculated by the following expression, where f2 and f3 are frequencies at which Vs/Vstestfr1 satisfies 1/√2 through the application of the test alternating voltage Vtest while sweeping the frequency:

$$Q = \frac{fr}{(f2 - f3)}$$

ii. After long-term use, the test alternating voltage Vtest is applied similarly to the above-mentioned item i. The frequency of the test alternating voltage is swept at a frequency close to the resonance frequency, thereby calculating a drive-mode Q-factor Q2 from the measurement of the voltage Vs of the detection piezoelectric element and calculating a value of a voltage Vstestfr2 of the detection piezoelectric element which is measured at the resonance frequency under the application of the test alternating voltage Vtest.

iii. Based on the measurement results of the above-mentioned items i and ii, variations in mechanical resistance of the piezoelectric vibrator and variations in piezoelectric characteristic of the piezoelectric element are calculated. The mechanical resistance and the Q-factor have the reciprocal relationship, and hence the variations in mechanical resistance, which are represented by r2/r1, are calculated by Expression (8) below:

$$\frac{r2}{r1} = \frac{Q1}{Q2} \qquad (8)$$

The variations in piezoelectric characteristic, which are represented by d2/d1, are calculated as follows. Vstestfr1 and Vstestfr2 are expressed by Expressions (9) and (10) below, respectively, similarly to Expressions (5) and (6):

$$Vstestfr1 = -\frac{a \cdot b \cdot d1^2 \cdot Vtest}{j \cdot 2 \cdot \pi \cdot fr \cdot Cd \cdot r1} \qquad (9)$$

$$Vstestfr2 = -\frac{a \cdot b \cdot d2^2 \cdot Vtest}{j \cdot 2 \cdot \pi \cdot fr \cdot Cd \cdot r2} \qquad (10)$$

Therefore, from Expressions (8), (9) and (10), Expression (11) below is derived to calculate the variations in piezoelectric characteristic:

$$\frac{d2}{d1} = \sqrt{\frac{Vtestfr2 \times Q1}{Vtestfr1 \times Q2}} \qquad (11)$$

Note that, Expression (11) above corresponds to the following expression:

$$\frac{d2}{d1} = \sqrt{\frac{Vs2 \times Q1}{Vs1 \times Q2}}$$

where Vs1 is an initial voltage of the detection piezoelectric element under the application of an alternating voltage for variation detection having a frequency matching the resonance frequency, and Vs2 is a voltage of the detection piezoelectric element under the application of the alternating voltage for variation detection having the frequency matching the resonance frequency after at least one of the variations in mechanical resistance and the variations in piezoelectric characteristic have occurred.

iv. A voltage obtained by adjusting the alternating voltage Vin1 as to the variations in mechanical resistance and the variations in piezoelectric characteristic, that is, a voltage Vin2 expressed by Expression (12) below is applied as a new driving voltage to the driving piezoelectric element via the driving voltage application electrode 6:

$$Vin2 = \frac{1}{\frac{d2}{d1}} \times \frac{r2}{r1} \times Vin1 = \frac{d1}{d2} \times \frac{r2}{r1} \times Vin1 \qquad (12)$$

A vibration velocity in this case is as expressed by Expression (13) below. Through the process described above, even after at least one of the variations in mechanical resistance of the piezoelectric vibrator and the variations in piezoelectric characteristic of the piezoelectric element have occurred, the vibration velocity having the same magnitude as before the variations can be determined.

$$v = \frac{a \cdot d2 \cdot Vin2}{r2} = \frac{a \cdot d2}{r2} \times \frac{d1}{d2} \times \frac{r2}{r1} \times Vin1 = \frac{a \cdot d1 \cdot Vin1}{r1} = v1 \qquad (13)$$

As described above, in the driving method for a piezoelectric vibrator for causing the piezoelectric vibrator to vibrate by applying, to the driving piezoelectric element, an alternating voltage having a frequency close to the resonance frequency of the piezoelectric vibrator, the variations in vibration amplitude of the piezoelectric vibrator are adjusted as follows, to thereby obtain a desired vibration amplitude.

The variations in mechanical resistance of the piezoelectric vibrator and the variations in piezoelectric characteristic of the piezoelectric element are detected based on the output voltage of the detection piezoelectric element formed of the same material as that of the driving piezoelectric element.

Then, in the case where at least one of the variations in mechanical resistance of the piezoelectric vibrator and the variations in piezoelectric characteristic of the piezoelectric element have occurred, an alternating voltage which is adjusted based on the detected variations in mechanical resistance of the piezoelectric vibrator and the detected variations in piezoelectric characteristic of the piezoelectric element is applied to adjust an electrical input to the piezoelectric vibrator. This way, the variations in vibration amplitude of the piezoelectric vibrator are adjusted, to thereby obtain a desired vibration amplitude.

Note that, in the above-mentioned embodiment, the Q-factors of the piezoelectric vibrator are calculated based on the resonance frequency and the frequencies at which Vs/Vstestfr1 satisfies 1/√2, and further the variations d2/d1 in piezoelectric characteristic and the variations r2/r1 in mechanical resistance are calculated. However, this is not limited thereto for the following reason.

Vibration in a piezoelectric vibrator is vibration consisting of mass, spring and damping. Accordingly, information necessary for identifying parameters of the vibration, including mass, spring and damping, for determining the variations d2/d1 in piezoelectric characteristic and the variations r2/r1 in mechanical resistance includes information on amplitudes or their phases at two or more kinds of frequencies including the resonance frequency or information on amplitudes or their phases at three or more kinds of frequencies.

That is, for example, the variations d2/d1 in piezoelectric characteristic and the variations r2/r1 in mechanical resistance may be calculated from any of the following: the resonance frequency, a voltage of the detection piezoelectric element at a driving frequency corresponding to the resonance frequency, and a voltage of the detection piezoelectric element at a driving frequency different from the resonance frequency and its driving frequency; the resonance frequency, a phase of the voltage of the detection piezoelectric element at the driving frequency corresponding to the resonance frequency with respect to the driving voltage, a phase of the voltage of the detection piezoelectric element at the driving frequency different from the resonance frequency with respect to the driving voltage and its driving frequency; three kinds of frequencies, and a voltage of the detection piezoelectric element at a driving frequency corresponding to each of the three kinds of frequencies; and three kinds of frequencies, and a phase of the voltage of the detection piezoelectric element at the driving frequency corresponding to each of the three kinds of frequencies with respect to the driving voltage.

Further, in the above-mentioned embodiment, through the measurement of the voltage of the detection piezoelectric element under the successive application of the alternating voltage for variation detection having two or more different kinds of frequencies to the driving piezoelectric element, the Q-factors of the piezoelectric vibrator are calculated and further the variations d2/d1 in piezoelectric characteristic and the variations r2/r1 in mechanical resistance are calculated.

However, the Q-factors may be determined by another commonly-known method, such as from the damping characteristic of vibration.

In the above-mentioned embodiment, in the case where at least one of the variations in mechanical resistance of the piezoelectric vibrator and the variations in piezoelectric characteristic of the piezoelectric element have occurred, an electrical input to the piezoelectric vibrator is adjusted through the application of an alternating voltage having a adjusted magnitude.

In the case where the driving voltage to be applied to the driving piezoelectric element is a pulsed voltage or a rectangular-wave voltage, adjustment may be carried out not only by changing an amplitude value of the driving voltage but also by changing a pulse width or a duty of the rectangular wave of the driving voltage.

That is, in the rectangular-wave voltage, a frequency component contributing to the driving of the piezoelectric vibrator varies in magnitude by changing the pulse width or the duty of the rectangular wave, and hence the electrical input to the piezoelectric vibrator may be adjusted through the application of an alternating voltage which is adjusted based on such change.

Second Embodiment

Figure 2:
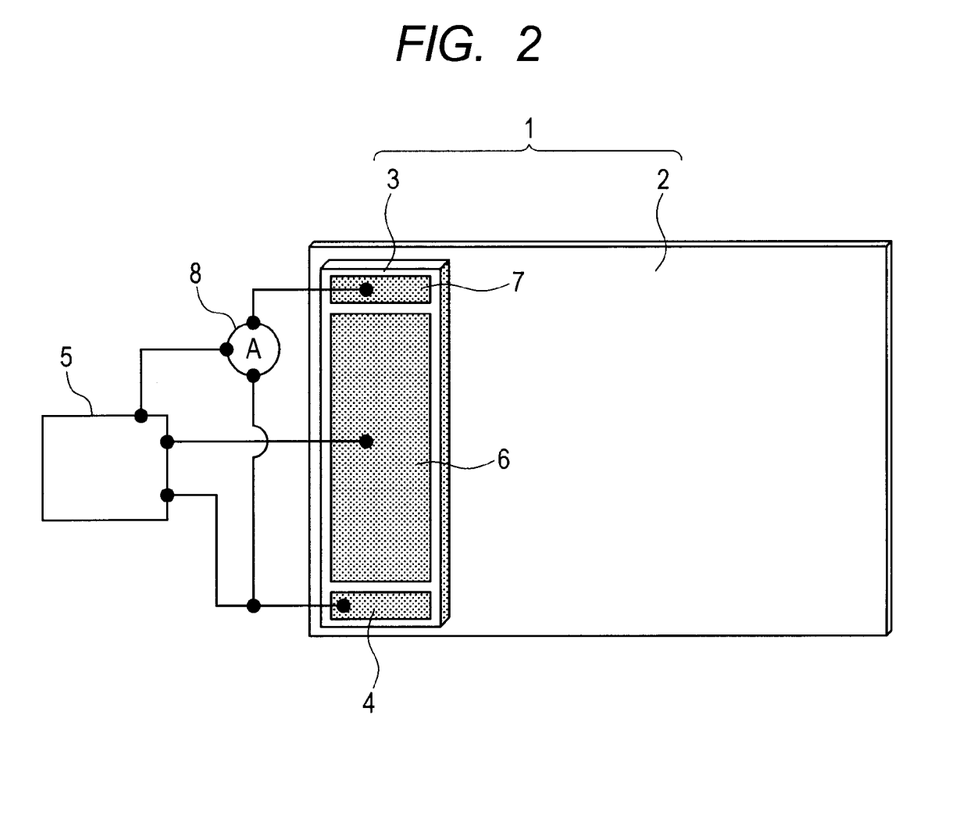
FIG. 2 is a diagram illustrating a configuration example of a piezoelectric vibrator for use in a dust removing device for removing dust adhering onto an optical element of a single lens reflex camera according to a second embodiment of the present invention.

Referring to FIG. 2, a second embodiment of the present invention is described by way of a configuration example of a piezoelectric vibrator for use in a dust removing device for removing dust adhering onto an optical element of a single lens reflex camera in the form different from the first embodiment.

The second embodiment is a modified example of the first embodiment, in which a piezoelectric vibrator of FIG. 2 is also a modification of the piezoelectric vibrator of FIG. 1. Accordingly, the difference from the first embodiment and FIG. 1 is mainly described here, and members of FIG. 2 denoted by the same reference numerals as those of FIG. 1 have the features similar to those described above with reference to FIG. 1. In FIG. 2, the output of the detection electrode 7 is connected to the surface ground electrode 4 via a current detection unit 8, such as a current probe.

The current detection unit 8 has so extremely small internal impedance that the detection electrode 7 is in substantially the same state as being short-circuited with the surface ground electrode 4. An output of the current detection unit 8 is wired to the detection terminal of the driving circuit 5.

Hereinafter, a driving method for a piezoelectric vibrator according to the second embodiment is described.

In the case where an alternating voltage Vin1 having the same frequency as the resonance frequency is input to the driving piezoelectric element via the driving voltage application electrode 6, a vibration with the following vibration velocity v1 expressed by Expression (3) is generated:

$$v1 = \frac{Adr1 \cdot Vin1}{r1} = \frac{a \cdot d1 \cdot Vin1}{r1} \qquad (3)$$

where Adr1 is a force factor of the driving piezoelectric element, r1 is a mechanical impedance at resonance of the piezoelectric vibrator, namely an initial mechanical resistance, d1 is an initial piezoelectric constant of the piezoelectric element, and a is a coefficient between the force factor of the driving piezoelectric element and the piezoelectric constant of the piezoelectric element.

In this case, the detection piezoelectric element generates electric charges corresponding to the vibration, and hence a current flows from the detection electrode 7 to the surface ground electrode 4. The magnitude of the current is expressed by Is1 below, and the current is detected by the current detection unit 8. The output value of the current detection unit 8 is input to the driving circuit 5 via the detection terminal of the driving circuit 5.

Expression (14) below is obtained by setting the voltage V of Expression (2) to zero:

$$Is1 = As1 \cdot v1 = b \cdot d1 \cdot v1 \qquad (14)$$

where As1 is a force factor of the detection piezoelectric element, b is a coefficient between the force factor of the detection piezoelectric element and the piezoelectric constant of the piezoelectric element, and d1 is a piezoelectric constant of the piezoelectric element.

Further, from Expressions (3) and (14), Expression (15) below is derived, and the current expressed by Expression (15) flows from the detection electrode 7 to the surface ground electrode 4:

$$Is1 = \frac{a \cdot b \cdot d1^2 \cdot Vin1}{r1} \qquad (15)$$

After long-term use of the piezoelectric vibrator 1, in the case where the piezoelectric constant of the piezoelectric element changes from d1 to d2 and in the case where the mechanical resistance changes from r1 to r2, a current of mechanically vibrating part has a magnitude expressed by Expression (16) below:

$$Is2 = \frac{a \cdot b \cdot d2^2 \cdot Vin1}{r2} \qquad (16)$$

A vibration velocity v2 in this case is expressed by Expression (7):

$$v2 = \frac{a \cdot d2 \cdot Vin1}{r2} = \frac{d2}{d1} \times \frac{r1}{r2} \times v1 \qquad (7)$$

According to the driving method of the second embodiment, even after at least one of the variations in mechanical resistance of the piezoelectric vibrator and the variations in piezoelectric characteristic of the piezoelectric element have occurred, the vibration velocity having the same magnitude as that before the variations is obtained in the following manner.

i. A test alternating voltage Vtest is applied before the variations in mechanical resistance of the piezoelectric vibrator or the variations in piezoelectric characteristic of the piezoelectric element occur. The frequency of the test alternating voltage is swept at a frequency close to the resonance frequency, thereby storing a drive-mode Q-factor Q1 which is calculated from the measurement of the current Is of the detection piezoelectric element and storing a value of a current Istestfr1 of the detection piezoelectric element which is measured at the resonance frequency under the application of the test alternating voltage Vtest. Note that, the resonance frequency is a frequency at which the current Is of the detection piezoelectric element becomes maximum when the frequency of the test alternating voltage is swept. The Q-factor as used herein is quality factor of resonator, and because the current of the detection piezoelectric element is almost proportional to the vibration amplitude, the Q-factor is calculated by a commonly-known method based on frequencies at which the current amplitude of the detection piezoelectric element becomes $1/\sqrt{2}$ of the amplitude at the resonance frequency. That is, the Q-factor is calculated by the following expression, where f2 and f3 are frequencies at which Is/Istestfr1 satisfies $1/\sqrt{2}$ through the application of the test alternating voltage Vtest while sweeping the frequency, and fr is the resonance frequency:

$$Q = \frac{fr}{(f2 - f3)}$$

ii. After long-term use, the test alternating voltage Vtest is applied similarly to the above-mentioned item i. The frequency of the test alternating voltage is swept at a frequency close to the resonance frequency, thereby calculating a drive-mode Q-factor Q2 from the measurement of the current Is of the detection piezoelectric element and calculating a value of a current Istestfr2 of the detection piezoelectric element which is measured at the resonance frequency under the application of the test alternating voltage Vtest.

iii. Based on the measurement results of the above-mentioned items i and ii, variations in mechanical resistance of the piezoelectric vibrator and variations in piezoelectric characteristic of the piezoelectric element are calculated. The mechanical resistance and the Q-factor have the reciprocal relationship, and hence the variations in mechanical resistance, which are represented by r2/r1, are calculated by Expression (8):

$$\frac{r2}{r1} = \frac{Q1}{Q2} \quad (8)$$

The variations in piezoelectric characteristic, which are represented by d2/d1, are calculated as follows. Istestfr1 and Istestfr2 are expressed by Expressions (17) and (18) below, respectively, similarly to Expressions (15) and (16):

$$Istestfr1 = \frac{a \cdot b \cdot d1^2 \cdot Vtest}{r1} \quad (17)$$

$$Istestfr2 = \frac{a \cdot b \cdot d2^2 \cdot Vtest}{r2} \quad (18)$$

Therefore, from Expressions (8), (17) and (18), the variations in piezoelectric characteristic are calculated as Expression (19) below:

$$\frac{d2}{d1} = \sqrt{\frac{Istestfr2 \times Q1}{Istestfr1 \times Q2}} \quad (19)$$

Note that, Expression (19) above corresponds to the following expression:

$$\frac{d2}{d1} = \sqrt{\frac{Is2 \times Q1}{Is1 \times Q2}}$$

where Is1 is an initial current of the detection piezoelectric element under the application of an alternating voltage for variation detection having a frequency matching the resonance frequency; and Is2 is a current of the detection piezoelectric element under the application of the alternating voltage for variation detection having the frequency matching the resonance frequency after at least one of the variations in mechanical resistance and the variations in piezoelectric characteristic have occurred.

The variations r2/r1 in mechanical resistance and the variations d2/d1 in piezoelectric characteristic are calculated, and by the same method as in the first embodiment, even after at least one of the variations in mechanical resistance of the piezoelectric vibrator and the variations in piezoelectric characteristic of the piezoelectric element have occurred, the vibration velocity having the same magnitude as before the variations can be obtained.

That is, as described above, in the driving method for a piezoelectric vibrator for causing the piezoelectric vibrator to vibrate by applying, to the driving piezoelectric element, an alternating voltage having a frequency close to the resonance frequency of the piezoelectric vibrator, the variations in vibration amplitude of the piezoelectric vibrator are adjusted as follows, to thereby obtain a desired vibration amplitude.

The variations in mechanical resistance of the piezoelectric vibrator and the variations in piezoelectric characteristic of the piezoelectric element are detected based on the output current of the detection piezoelectric element formed of the same material as that of the driving piezoelectric element.

Then, in the case where at least one of the variations in mechanical resistance of the piezoelectric vibrator and the variations in piezoelectric characteristic of the piezoelectric element have occurred, an alternating voltage which is adjusted based on the detected variations in mechanical resistance of the piezoelectric vibrator and the detected variations in piezoelectric characteristic of the piezoelectric element is applied to adjust an electrical input to the piezoelectric vibrator.

According to the above, the variations in vibration amplitude of the piezoelectric vibrator are adjusted, to thereby obtain a desired vibration amplitude.

Third Embodiment

Figure 3:
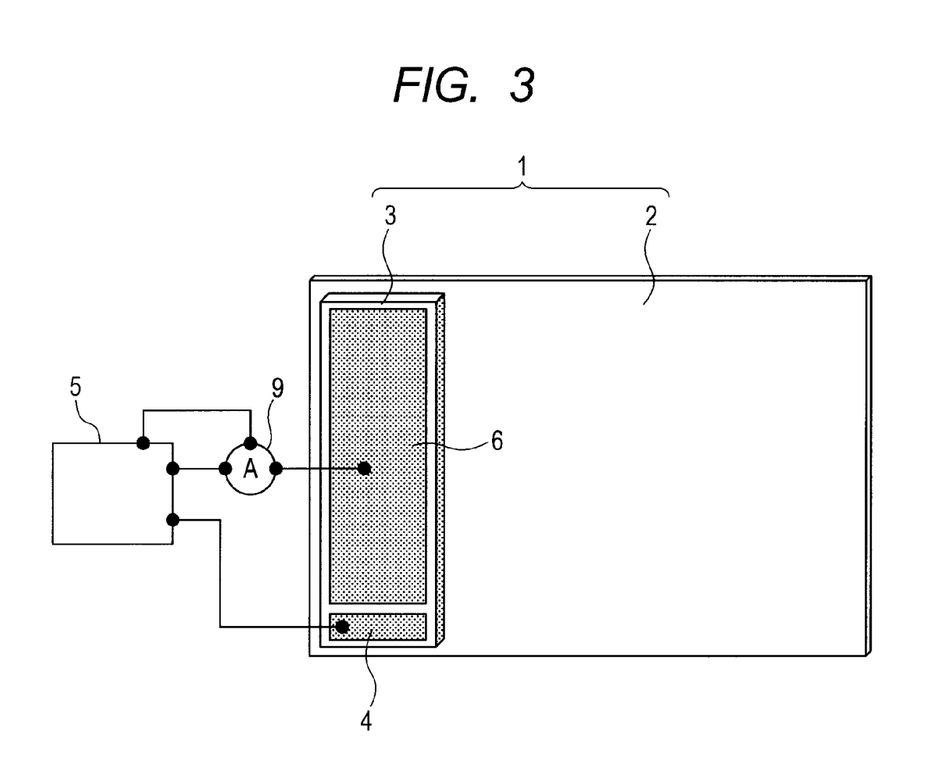
FIG. 3 is a diagram illustrating a configuration example of a piezoelectric vibrator for use in a dust removing device for removing dust adhering onto an optical element of a single lens reflex camera according to a third embodiment of the present invention.

Referring to FIG. 3, a third embodiment of the present invention is described by way of a configuration example of a piezoelectric vibrator for use in a dust removing device for removing dust adhering onto an optical element of a single lens reflex camera in the form different from the above-mentioned respective embodiments.

In the first and second embodiments, the variations in mechanical resistance of the piezoelectric vibrator and the variations in piezoelectric characteristic of the piezoelectric element are detected based on the output of the detection piezoelectric element, which is provided separately from the driving piezoelectric element.

In the third embodiment, unlike the first and second embodiments, the variations in mechanical resistance of the piezoelectric vibrator and the variations in piezoelectric characteristic of the piezoelectric element are detected based on a current of the driving piezoelectric element flowing when an alternating voltage is applied to the driving piezoelectric element.

In other words, the third embodiment is a modified example of the second embodiment, in which the driving piezoelectric element is used also as the detection piezoelectric element, and the variations in mechanical resistance of the piezoelectric vibrator and the variations in piezoelectric characteristic of the piezoelectric element are detected by a different method.

Hereinafter, a driving method for a piezoelectric vibrator according to the third embodiment is described.

A piezoelectric vibrator of FIG. 3 is also a modification of the piezoelectric vibrator of FIG. 2. Accordingly, the difference from the second embodiment and FIG. 2 is described here, and members of FIG. 3 denoted by the same reference numerals as those of FIG. 2 have the features similar to those described above with reference to FIG. 2.

In FIG. 3, a current of the driving piezoelectric element is detected by a current detection unit 9 provided between the driving circuit 5 and the driving voltage application electrode 6, and an output of the current detection unit 9 is wired to the detection terminal of the driving circuit 5.

In the case where an alternating voltage Vin1 having the same frequency as the resonance frequency is input to the driving piezoelectric element via the driving voltage application electrode 6, a vibration with the following vibration velocity v1 expressed by Expression (3) is generated:

$$v1 = \frac{Adr1 \cdot Vin1}{r1} = \frac{a \cdot d1 \cdot Vin1}{r1} \quad (3)$$

where Adr1 is a force factor of the driving piezoelectric element, r1 is a mechanical impedance at resonance of the piezoelectric vibrator, namely an initial mechanical resistance, d1 is an initial piezoelectric constant of the piezoelectric element, and a is a coefficient between the force factor of the driving piezoelectric element and the piezoelectric constant of the piezoelectric element.

According to Expression (2) which is a commonly-known piezoelectric equation, from the current of the driving piezoelectric element detected on this occasion, a damped-capacitance current calculated from a premeasured damped capacitance of the driving piezoelectric element is subtracted. Then, the current having the magnitude proportional to the vibration amplitude, called current of mechanically vibrating part, is calculated.

That is, a current of mechanically vibrating part 1 ml expressed by Expression (20) below from Expressions (2) and (3) is calculated:

$$Im1 = I1 - Yd \cdot Vin1 = Adr1 \cdot v1 = \frac{a^2 \cdot d1^2 \cdot Vin1}{r1} \quad (20)$$

where I1 is a current of the driving piezoelectric element.

Further, the current of mechanically vibrating part is almost proportional to the vibration amplitude, and can therefore be utilized for calculating a Q-factor similarly to the voltage and the current of the detection piezoelectric element in the first and second embodiments. That is, by sweeping the frequency of the voltage Vin1 to be applied to the driving piezoelectric element to determine frequencies f2 and f3 at which the current of mechanically vibrating part becomes $1/\sqrt{2}$ of 1 ml, a Q-factor Q1 on this occasion is determined from the following expression:

$$Q = \frac{fr}{(f2 - f3)}$$

where fr is the resonance frequency.

If the resonance frequency is not known, fr is set as a frequency at which the current of mechanically vibrating part becomes maximum when the test alternating voltage is applied to the driving piezoelectric element and the frequency thereof is swept. In the case where the piezoelectric constant of the piezoelectric element changes from d1 to d2 and in the case where the mechanical resistance changes from r1 to r2, the vibration velocity and the current of mechanically vibrating part obtained when the alternating voltage Vin1 having the same frequency as the resonance frequency is input to the driving piezoelectric element are expressed as v2 and Im2 in the following expressions, respectively:

$$v2 = \frac{a \cdot d2 \cdot Vin1}{r2} = \frac{d2}{d1} \times \frac{r1}{r2} \times v1 \quad (21)$$

$$Im2 = I1 - Yd \cdot Vin1 = Adr2 \cdot v2 = \frac{a^2 \cdot d2^2 \cdot Vin1}{r2} \quad (22)$$

where I1 is a current of the driving piezoelectric element.

Further, using the same method as that for the above-mentioned Q-factor Q1, a Q-factor Q2 after the piezoelectric constant of the piezoelectric element has changed from d1 to d2 and the mechanical resistance has changed from r1 to r2 is calculated. From the above-mentioned Q-factors Q1 and Q2, the variations r2/r1 in mechanical resistance of the piezoelectric vibrator are calculated as Expression (23) below:

$$\frac{r2}{r1} = \frac{Q1}{Q2} \quad (23)$$

Further, based on Expressions (20), (22) and (23), the variations d2/d1 in piezoelectric characteristic of the piezoelectric element are calculated from Expression (24) below:

$$\frac{d2}{d1} = \sqrt{\frac{Im2 \times Q1}{Im1 \times Q2}} \quad (24)$$

By the above-mentioned method, the variations r2/r1 in mechanical resistance of the piezoelectric vibrator and the variations d2/d1 in piezoelectric characteristic of the piezoelectric element are calculated, and further by the same method as in the first embodiment, even after at least one of the variations in mechanical resistance and the variations in piezoelectric characteristic have occurred, the vibration velocity having the same magnitude as before the variations can be obtained.

Fourth Embodiment

A driving method for a piezoelectric vibrator according to a fourth embodiment of the present invention is described.

As is known, by changing the frequency of an alternating voltage to be applied to the piezoelectric vibrator, an electrical input can be changed.

In the driving method for a piezoelectric vibrator according to the fourth embodiment, the frequency of a driving alternating voltage to be applied to the piezoelectric vibrator is changed so that an input power to be input to the piezoelectric vibrator after at least one of variations in mechanical resistance of the piezoelectric vibrator and variations in piezoelectric characteristic of the piezoelectric element have occurred may become P2 expressed by Expression (25) to be described below.

Hereinafter, the driving method for a piezoelectric vibrator according to the fourth embodiment is described in detail.

The variations r2/r1 in mechanical resistance of the piezoelectric vibrator after at least one of the variations in mechanical resistance of the piezoelectric vibrator and the variations in piezoelectric characteristic of the piezoelectric element have occurred are calculated by, for example, the method described in each of the first to third embodiments.

Then, the frequency of the driving alternating voltage to be applied to the piezoelectric vibrator is changed so that the input power to be input to the piezoelectric vibrator after at least one of the variations in mechanical resistance of the piezoelectric vibrator and the variations in piezoelectric characteristic of the piezoelectric element have occurred may become P2 expressed by Expression (25) below:

$$P2 = \frac{r2}{r1} \times P1 \qquad (25)$$

where P1 is an initial magnitude of power input to the piezoelectric vibrator, P2 is a magnitude of the power to be input to the piezoelectric vibrator after at least one of the variations in mechanical resistance and variations in piezoelectric characteristic have occurred, r1 is an initial mechanical resistance, and r2 is a mechanical resistance after at least one of the variations in mechanical resistance and variations in piezoelectric characteristic have occurred.

P1 and P2 in Expression (25) above are detected by a commonly-known power detection unit, for example, a wattmeter provided between the piezoelectric vibrator and the driving circuit. Power consumption of the piezoelectric vibrator is generally expressed by Expression (26) below:

$$P = r \times v^2 \qquad (26)$$

where P is power consumption, r is a mechanical resistance, and v is a vibration velocity.

Therefore, an initial vibration velocity v1 and a vibration velocity v2 after at least one of the variations in mechanical resistance and the variations in piezoelectric characteristic have occurred are expressed as follows:

$$v1 = \sqrt{\frac{P1}{r1}} \qquad (27)$$

$$v2 = \sqrt{\frac{P2}{r2}} \qquad (28)$$

where P1 is initial power consumption, P2 is power consumption after variations in mechanical resistance have occurred, r1 is an initial mechanical resistance, and r2 is a mechanical resistance after variations in mechanical resistance have occurred.

Therefore, the initial vibration velocity v1 and the vibration velocity v2 which is determined by adjusting the input power to the one expressed by Expression (25) after at least one of the variations in mechanical resistance and the variations in piezoelectric characteristic have occurred are calculated as Expression (29) below:

$$v2 = \sqrt{\frac{P2}{r2}} = \sqrt{\frac{\frac{r2}{r1} \times P1}{r2}} = \sqrt{\frac{P1}{r1}} = v1 \qquad (29)$$

In other words, the vibration velocity after at least one of the variations in mechanical resistance and the variations in piezoelectric characteristic have occurred can be made the same as the initial vibration velocity.

As described above, by adjusting an electrical input to the piezoelectric vibrator so as to be the input power expressed by Expression (25) through the change in frequency of the alternating voltage to be applied to the driving piezoelectric element, the variations in vibration amplitude of the piezoelectric vibrator can be adjusted.

Alternatively, the electrical input to the piezoelectric vibrator may be adjusted so as to be the input power expressed by Expression (25) through the change in alternating voltage to be applied to the driving piezoelectric element.

Note that, the above-mentioned embodiments have described an example in which the driving method for a piezoelectric vibrator according to the present invention is applied to a dust removing device, but the present invention is not limited to this example.

For example, the driving method for a piezoelectric vibrator according to the present invention is also applicable to an ultrasonic motor including a piezoelectric vibrator and a movable body which is in frictional contact with the piezoelectric vibrator and capable of moving by vibration of the piezoelectric vibrator, and to other similar devices.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-247633, filed Nov. 4, 2010, which is hereby incorporated by reference herein in its entirety.

What is claimed is:

1. A driving method for a piezoelectric vibrator comprising a driving piezoelectric element and a detection piezoelectric element formed of the same material as a material of the driving piezoelectric element the driving method comprising:
   calculating at least one of variations in mechanical resistance of the piezoelectric vibrator and variations in a piezoelectric characteristic of a piezoelectric element; and
   applying an alternating voltage which is adjusted in accordance with the at least one of variations in mechanical resistance of the piezoelectric vibrator and the variations in the piezoelectric characteristic of the piezoelectric element, to thereby adjust an electrical input to the piezoelectric vibrator to suppress variations in vibration amplitude of the piezoelectric vibrator.

2. A driving method for a piezoelectric vibrator according to claim 1, wherein the adjustment of the electrical input to the piezoelectric vibrator is carried out by changing a magnitude of the alternating voltage to be applied to the driving piezoelectric element.

3. A driving method for a piezoelectric vibrator according to claim 2, further comprising, after the at least one of the variations in mechanical resistance of the piezoelectric vibrator and the variations in the piezoelectric characteristic of the piezoelectric element have occurred, determining the magnitude of the alternating voltage to be applied to the driving piezoelectric element based on the following expression, $$Vin2 = \frac{1}{\frac{d2}{d1}} \times \frac{r2}{r1} \times Vin1 = \frac{d1}{d2} \times \frac{r2}{r1} \times Vin1$$

wherein Vin1 is an initial magnitude of the alternating voltage to be applied to the driving piezoelectric element, wherein Vin2 is the magnitude of the alternating voltage to be applied to the driving piezoelectric element after the at least one of the variations in mechanical resistance and the variations in the piezoelectric characteristic have occurred, wherein d1 is an initial piezoelectric constant, wherein d2 is a piezoelectric constant after the at least one of the variations in mechanical resistance and the variations in piezoelectric characteristic have occurred, wherein r1 is an initial mechanical resistance, and wherein r2 is a mechanical resistance after the at least one of the variations in mechanical resistance and the variations in the piezoelectric characteristic have occurred.

4. A driving method for a piezoelectric vibrator according to claim 3, further comprising:

applying, to the driving piezoelectric element, (i) a first voltage with a first frequency, a second voltage with a second frequency, and a third voltage with a third frequency, or (ii) a fourth voltage with a fourth frequency, a fifth voltage with a fifth frequency, and a sixth voltage with a resonance frequency of the piezoelectric vibrator, as alternating voltages for variation detection, wherein the first frequency, the second frequency, the third frequency, the fourth frequency, and the fifth frequency are close to the resonance frequency;

measuring a voltage of the detection piezoelectric element when the alternating voltages for variation detection are applied, to thereby calculate a Q-factor of the piezoelectric vibrator after the at least one of the variations in mechanical resistance of the piezoelectric vibrator and the variations in piezoelectric characteristic of the piezoelectric element have occurred; and calculating d2/d1 and r2/r1 in the expression based on the calculated Q-factor and the following expressions, $$\frac{d2}{d1} = \sqrt{\frac{Vs2 \times Q1}{Vs1 \times Q2}}$$

$$\frac{r2}{r1} = \frac{Q1}{Q2}$$

wherein Vs1 is an initial voltage of the detection piezoelectric element under the application of the alternating voltage for variation detection having a frequency matching the resonance frequency, wherein Vs2 is a voltage of the detection piezoelectric element under the application of the alternating voltage for variation detection having the frequency matching the resonance frequency after the at least one of the variations in mechanical resistance and the variations in the piezoelectric characteristic have occurred, wherein Q1 is an initial Q-factor of the piezoelectric vibrator, and wherein Q2 is the Q-factor of the piezoelectric vibrator after the at least one of the variations in mechanical resistance and the variations in piezoelectric characteristic have occurred.

5. A driving method for a piezoelectric vibrator according to claim 3, further comprising:

applying, to the driving piezoelectric element, (i) a first voltage with a first frequency, a second voltage with a second frequency, and a third voltage with a third frequency, or (ii) a fourth voltage with a fourth frequency, a fifth voltage with a fifth frequency, and a sixth voltage with a resonance frequency of the piezoelectric vibrator, as alternating voltages for variation detection, wherein the first frequency, the second frequency, the third frequency, the fourth frequency, and the fifth frequency are close to the resonance frequency;

measuring a current of the detection piezoelectric element when the alternating voltages for variation detection are applied, to thereby calculate a Q-factor of the piezoelectric vibrator after the at least one of the variations in mechanical resistance of the piezoelectric vibrator and the variations in the piezoelectric characteristic of the piezoelectric element have occurred; and calculating d2/d1 and r2/r1 based on the calculated Q-factor and the following expressions, $$\frac{d2}{d1} = \sqrt{\frac{Is2 \times Q1}{Is1 \times Q2}}$$

$$\frac{r2}{r1} = \frac{Q1}{Q2}$$

wherein Is1 is an initial current of the detection piezoelectric element under the application of the alternating voltage for variation detection having a frequency matching the resonance frequency, wherein Is2 is a current of the detection piezoelectric element under the application of the alternating voltage for variation detection having the frequency matching the resonance frequency after the at least one of the variations in mechanical resistance and the variations in piezoelectric characteristic have occurred, wherein Q1 is an initial Q-factor of the piezoelectric vibrator, and wherein Q2 is the Q-factor of the piezoelectric vibrator after the at least one of the variations in mechanical resistance and the variations in the piezoelectric characteristic have occurred.

6. A driving method for a piezoelectric vibrator comprising a driving piezoelectric element, the driving method comprising;

calculating at least one of variations in mechanical resistance of the piezoelectric vibrator and variations in a piezoelectric characteristic of a piezoelectric element; and applying an alternating voltage which is adjusted in accordance with the at least one of variations in mechanical resistance of the piezoelectric vibrator and the detected variations in the piezoelectric characteristic of the piezoelectric element, to thereby adjust an electrical input to the piezoelectric vibrator.

7. A driving method for a piezoelectric vibrator according to claim 6, wherein the adjustment of the electrical input to the piezoelectric vibrator is carried out by changing a magnitude of the alternating voltage to be applied to the driving piezoelectric element.

8. A driving method for a piezoelectric vibrator according to claim 7, further comprising, after the at least one of the variations in mechanical resistance of the piezoelectric vibrator and the variations in piezoelectric characteristic of the piezoelectric element have occurred, determining the magnitude of the alternating voltage to be applied to the driving piezoelectric element based on the following expression, $$Vin2 = \frac{1}{\frac{d2}{d1}} \times \frac{r2}{r1} \times Vin1 = \frac{d1}{d2} \times \frac{r2}{r1} \times Vin1$$

wherein Vin1 is an initial magnitude of the alternating voltage to be applied to the driving piezoelectric element, wherein Vin2 is the magnitude of the alternating voltage to be applied to the driving piezoelectric element after the at least one of the variations in mechanical resistance and the variations in the piezoelectric characteristic have occurred, wherein d1 is an initial piezoelectric constant, wherein d2 is a piezoelectric constant after the at least one of the variations in mechanical resistance and the variations in the piezoelectric characteristic have occurred, wherein r1 is an initial mechanical resistance, and wherein r2 is a mechanical resistance after the at least one of the variations in mechanical resistance and the variations in the piezoelectric characteristic have occurred.

9. A driving method for a piezoelectric vibrator according to claim 8, further comprising:

applying, to the driving piezoelectric element, (i) the first voltage, the second voltage, and the third voltage, or (ii) the fourth voltage, the fifth voltage, and the sixth voltage, as alternating voltages for variation detection;

measuring a current of the driving piezoelectric element when the alternating voltages for variation detection are applied, to thereby calculate a Q-factor of the piezoelectric vibrator after the at least one of the variations in mechanical resistance of the piezoelectric vibrator and the variations in the piezoelectric characteristic of the piezoelectric element have occurred; and calculating d2/d1 and r2/r1 based on the calculated Q-factor and the following expressions, $$\frac{d2}{d1} = \sqrt{\frac{Im2 \times Q1}{Im1 \times Q2}}$$

$$\frac{r2}{r1} = \frac{Q1}{Q2}$$

wherein Im1 is an initial current of mechanically vibrating part of the piezoelectric element under the application of the alternating voltage for variation detection having a frequency matching the resonance frequency, wherein Im2 is a current of mechanically vibrating part of the piezoelectric element under the application of the alternating voltage for variation detection having the frequency matching the resonance frequency after the at least one of the variations in mechanical resistance and the variations in piezoelectric characteristic have occurred, wherein Q1 is an initial Q-factor of the piezoelectric vibrator, and wherein Q2 is the Q-factor of the piezoelectric vibrator after the at least one of the variations in mechanical resistance and the variations in piezoelectric characteristic have occurred.

10. A driving method for a piezoelectric vibrator comprising a driving piezoelectric element, the driving method comprising:

calculating a variation in mechanical resistance of the piezoelectric vibrator; and adjusting an input power to a magnitude expressed by the following expression based on the variation in mechanical resistance of the piezoelectric vibrator, to thereby adjust variations in vibration amplitude of the piezoelectric vibrator, $$P2 = \frac{r2}{r1} \times P1$$

wherein P1 is an initial magnitude of the input power to the piezoelectric vibrator, wherein P2 is a magnitude of the input power to the piezoelectric vibrator to be adjusted in the case where the variations in mechanical resistance have occurred, wherein r1 is an initial mechanical resistance, and wherein r2 is a mechanical resistance in the case where the variations in mechanical resistance have occurred.

11. A driving method for a piezoelectric vibrator according to claim 10, wherein the variations in mechanical resistance of the piezoelectric vibrator are detected based on an output from a detection piezoelectric element formed of the same material as a material of the driving piezoelectric element.

12. A driving method for a piezoelectric vibrator according to claim 11, further comprising:

applying, to the driving piezoelectric element, (i) a first voltage with a first frequency, a second voltage with a second frequency, and a third voltage with a third frequency, or (ii) a fourth voltage with a fourth frequency, a fifth voltage with a fifth frequency, and a sixth voltage with a resonance frequency of the piezoelectric vibrator, as alternating voltages for variation detection, wherein the first frequency, the second frequency, the third frequency, the fourth frequency, and the fifth frequency are close to the resonance frequency; and measuring a voltage of the detection piezoelectric element when the alternating voltages for variation detection are applied, to thereby detect the variations in mechanical resistance of the piezoelectric vibrator.

13. A driving method for a piezoelectric vibrator according to claim 12, further comprising:

applying, to the driving piezoelectric element, (i) the first voltage, the second voltage, and the third voltage, or (ii) the fourth voltage, the fifth voltage, and the sixth voltage, as alternating voltages for variation detection;

measuring the voltage of the detection piezoelectric element when the alternating voltages for variation detection are applied, to thereby calculate a Q-factor of the piezoelectric vibrator after the variations in mechanical resistance of the piezoelectric vibrator have occurred; and calculating r2/r1 based on the calculated Q-factor and the following expression, $$\frac{r2}{r1} = \frac{Q1}{Q2}$$

wherein Q1 is an initial Q-factor of the piezoelectric vibrator, and wherein Q2 is the Q-factor of the piezoelectric vibrator after the variations in mechanical resistance have occurred.

14. A driving method for a piezoelectric vibrator according to claim 11, further comprising:

applying, to the driving piezoelectric element, (i) a first voltage with a first frequency, a second voltage with a second frequency, and a third voltage with a third frequency, or (ii) a fourth voltage with a fourth frequency, a fifth voltage with a fifth frequency, and a sixth voltage with a resonance frequency of the piezoelectric vibrator, as alternating voltages for variation detection, wherein the first frequency, the second frequency, the third frequency, the fourth frequency, and the fifth frequency are close to the resonance frequency; and measuring a current of the detection piezoelectric element when the alternating voltages for variation detection are applied, to thereby detect the variations in mechanical resistance of the piezoelectric vibrator.

15. A driving method for a piezoelectric vibrator according to claim 14, further comprising:

applying, to the driving piezoelectric element, (i) the first voltage, the second voltage, and the third voltage, or (ii) the fourth voltage, the fifth voltage, and the sixth voltage, as alternating voltages for variation detection;

measuring the current of the detection piezoelectric element when the alternating voltages for variation detection are applied, to thereby calculate a Q-factor of the piezoelectric vibrator after the variations in mechanical resistance of the piezoelectric vibrator have occurred; and calculating r2/r1 based on the calculated Q-factor and the following expression, $$\frac{r2}{r1} = \frac{Q1}{Q2}$$

wherein Q1 is an initial Q-factor of the piezoelectric vibrator, and wherein Q2 is the Q-factor of the piezoelectric vibrator after the variations in mechanical resistance have occurred.

16. A driving method for a piezoelectric vibrator according to claim 10, wherein the variations in mechanical resistance of the piezoelectric vibrator are detected based on a magnitude of a current when an alternating voltage for variation detection is applied to the driving piezoelectric element.

17. A driving method for a piezoelectric vibrator according to claim 16, further comprising:

applying, to the driving piezoelectric element, (i) a first voltage with a first frequency, a second voltage with a second frequency, and a third voltage with a third frequency, or (ii) a fourth voltage with a fourth frequency, a fifth voltage with a fifth frequency, and a sixth voltage with a resonance frequency of the piezoelectric vibrator, as alternating voltages for variation detection, wherein the first frequency, the second frequency, the third frequency, the fourth frequency, and the fifth frequency are close to the resonance frequency;

measuring the current of the driving piezoelectric element when the alternating voltages for variation detection are applied, to thereby calculate a Q-factor of the piezoelectric vibrator after the variations in mechanical resistance of the piezoelectric vibrator have occurred; and calculating r2/r1 based on the calculated Q-factor and the following expression, $$\frac{r2}{r1} = \frac{Q1}{Q2}$$

wherein Q1 is an initial Q-factor of the piezoelectric vibrator, and wherein Q2 is the Q-factor of the piezoelectric vibrator after the variations in mechanical resistance have occurred.

18. A driving method for a piezoelectric vibrator according to claim 10, wherein the adjustment of the input power to be input to the piezoelectric vibrator is carried out by changing a magnitude of the alternating voltage to be applied to the driving piezoelectric element.

19. A dust removing device, comprising a dust removing unit for removing dust on a target by vibration of a piezoelectric vibrator, wherein the piezoelectric vibrator is driven by the driving method for a piezoelectric vibrator according to claim 1.

20. A dust removing device, comprising a dust removing unit for removing dust on a target by vibration of a piezoelectric vibrator, wherein the piezoelectric vibrator is driven by the driving method for a piezoelectric vibrator according to claim 6.

21. A dust removing device, comprising a dust removing unit for removing dust on a target by vibration of a piezoelectric vibrator, wherein the piezoelectric vibrator is driven by the driving method for a piezoelectric vibrator according to claim 10.

22. An ultrasonic motor, comprising:

a piezoelectric vibrator; and a movable body which is in frictional contact with the piezoelectric vibrator and capable of moving by vibration of the piezoelectric vibrator, wherein the piezoelectric vibrator is driven by the driving method for a piezoelectric vibrator according to claim 1.

23. An ultrasonic motor, comprising:

a piezoelectric vibrator; and a movable body which is in frictional contact with the piezoelectric vibrator and capable of moving by vibration of the piezoelectric vibrator, wherein the piezoelectric vibrator is driven by the driving method for a piezoelectric vibrator according to claim 6.

24. An ultrasonic motor, comprising:

a piezoelectric vibrator; and a movable body which is in frictional contact with the piezoelectric vibrator and capable of moving by vibration of the piezoelectric vibrator, wherein the piezoelectric vibrator is driven by the driving method for a piezoelectric vibrator according to claim 10.

25. The driving method for a piezoelectric vibrator according to claim 1,
wherein the calculation of the at least one of variations in mechanical resistance of the piezoelectric vibrator and variations in the piezoelectric characteristic of the piezoelectric element is calculated from a voltage of the detection piezoelectric element or the driving piezoelectric element at a first timing and a voltage of the detection piezoelectric element or the driving piezoelectric element at a second timing, and
wherein the first timing is different from the second timing.

26. The driving method for a piezoelectric vibrator according to claim 6,
wherein the calculation of the at least one of variations in mechanical resistance of the piezoelectric vibrator and variations in the piezoelectric characteristic of the piezoelectric element is calculated from a voltage of the detection piezoelectric element or the driving piezoelectric element at a first timing and a voltage of the detection piezoelectric element or the driving piezoelectric element at a second timing, and
wherein the first timing is different from the second timing.

27. The driving method for a piezoelectric vibrator according to claim 10,
wherein the calculation of the variation in mechanical resistance of the piezoelectric vibrator is calculated from a voltage of the driving piezoelectric element at a first timing and a voltage of the detection piezoelectric element at a second timing, and
wherein the first timing is different from the second timing.

28. The driving method for a piezoelectric vibrator according to claim 10, wherein the alternating voltage has a frequency close to a resonance frequency of the piezoelectric vibrator.

* * * * *